(12) United States Patent
Miura (10) Patent No.: US 7,888,712 B2
(45) Date of Patent: Feb. 15, 2011

(54) SEMICONDUCTOR DEVICE AND METHOD FOR MANUFACTURING SAME

(75) Inventor: Mineo Miura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 575 days.

(21) Appl. No.: 11/883,641

(22) PCT Filed: Apr. 18, 2006

(86) PCT No.: PCT/JP2006/308136

§ 371 (c)(1),
(2), (4) Date: Aug. 3, 2007

(87) PCT Pub. No.: WO2006/115125

PCT Pub. Date: Nov. 2, 2006

(65) Prior Publication Data

US 2009/0020765 A1      Jan. 22, 2009

(30) Foreign Application Priority Data

Apr. 22, 2005  (JP) ............................. 2005-125497

(51) Int. Cl.
*H01L 29/66* (2006.01)

(52) U.S. Cl. ..................... 257/263; 257/76; 257/77; 257/128; 257/135; 257/242; 257/288; 257/341; 257/E27.029; 257/E27.055; 257/E27.057; 257/E27.059; 257/E27.06; 257/E29.169; 257/E29.183; 257/E29.262; 438/63; 438/135; 438/142; 438/143; 438/151; 438/167; 438/197

(58) Field of Classification Search .................. 257/76, 257/77, 128, 135, 242, 263, 288, E27.029, 257/E27.055, E27.057, E27.059, E27.06, 257/E27.065–E27.067, E27.096, E29.169, 257/E29.183, E29.242, E29.255, E29.256, 257/E29.262, 341, 342, 339; 438/63, 135, 438/142, 143, 151, 167, 197
See application file for complete search history.

(56) References Cited

U.S. PATENT DOCUMENTS 5,545,908 A    8/1996  Tokura et al.

(Continued)

FOREIGN PATENT DOCUMENTS

JP        63-087771        4/1988

(Continued)

*Primary Examiner*—Lynne A Gurley
*Assistant Examiner*—Meiya Li
(74) *Attorney, Agent, or Firm*—Rabin & Berdo, P.C.

(57) ABSTRACT

A semiconductor device includes a first conductive type SiC semiconductor substrate; a second conductive type well formed on the SiC semiconductor substrate; a first impurity diffusion layer formed by introducing a first conductive type impurity so as to be partly overlapped with the well in a region surrounding the well; a second impurity diffusion layer formed by introducing the first conductive type impurity in a region spaced apart for a predetermined distance from the impurity diffusion layer in the well; and a gate electrode opposed to a channel region between the first and the second impurity diffusion layers with gate insulating film sandwiched therebetween.

7 Claims, 7 Drawing Sheets

U.S. PATENT DOCUMENTS

| | | |
|---|---|---|
| 6,150,671 A | 11/2000 | Harris et al. |
| 6,238,980 B1 | 5/2001 | Ueno et al. |
| 2003/0052321 A1 | 3/2003 | Sridevan |
| 2004/0046202 A1* | 3/2004 | Nakayama et al. .......... 257/302 |
| 2004/0178454 A1* | 9/2004 | Kuroda et al. ............... 257/360 |

FOREIGN PATENT DOCUMENTS

| | | |
|---|---|---|
| JP | 2-231771 | 9/1990 |
| JP | 03-082163 | 4/1991 |
| JP | 62-11275 | 8/1994 |
| JP | 2001-94097 | 4/2001 |

* cited by examiner

SEMICONDUCTOR DEVICE AND METHOD FOR MANUFACTURING SAME

TECHNICAL FIELD

The present invention relates to a semiconductor device using a SiC (silicon carbide) semiconductor substrate and a method of manufacturing the same.

DESCRIPTION OF THE RELATED ART

Conventionally, a power MOSFET using Si (silicon) semiconductor substrate has been used for a power source (particularly those using an inverter) in household consumer electric appliances and electric vehicles (hybrid electric vehicles, for example).

In the field of power electronics, power loss in the devices during power conversion has been a problem and attempts have been made to reduce the loss. It has been said, however, the Power MOSFET formed of Si materials have almost achieved its technical limitations and it has come to a difficult phase to further pursue higher efficiency.

With this technical background, there has been a study on the application of SiC semiconductors to power devices. SiC is a compound with excellent physical properties. For example, SiC has about 3 times higher band gap and about 10 times higher dielectric breakdown electric field than Si. Application of SiC semiconductor to power devices, therefore, will be able to realize a device that can reduce the loss. It is also said, however, that, since the MOSFET using SiC semiconductor substrate has a problem of higher resistances in the channel portion, and thus it is said to be difficult to bring the technology to actual use.

Figure 6:
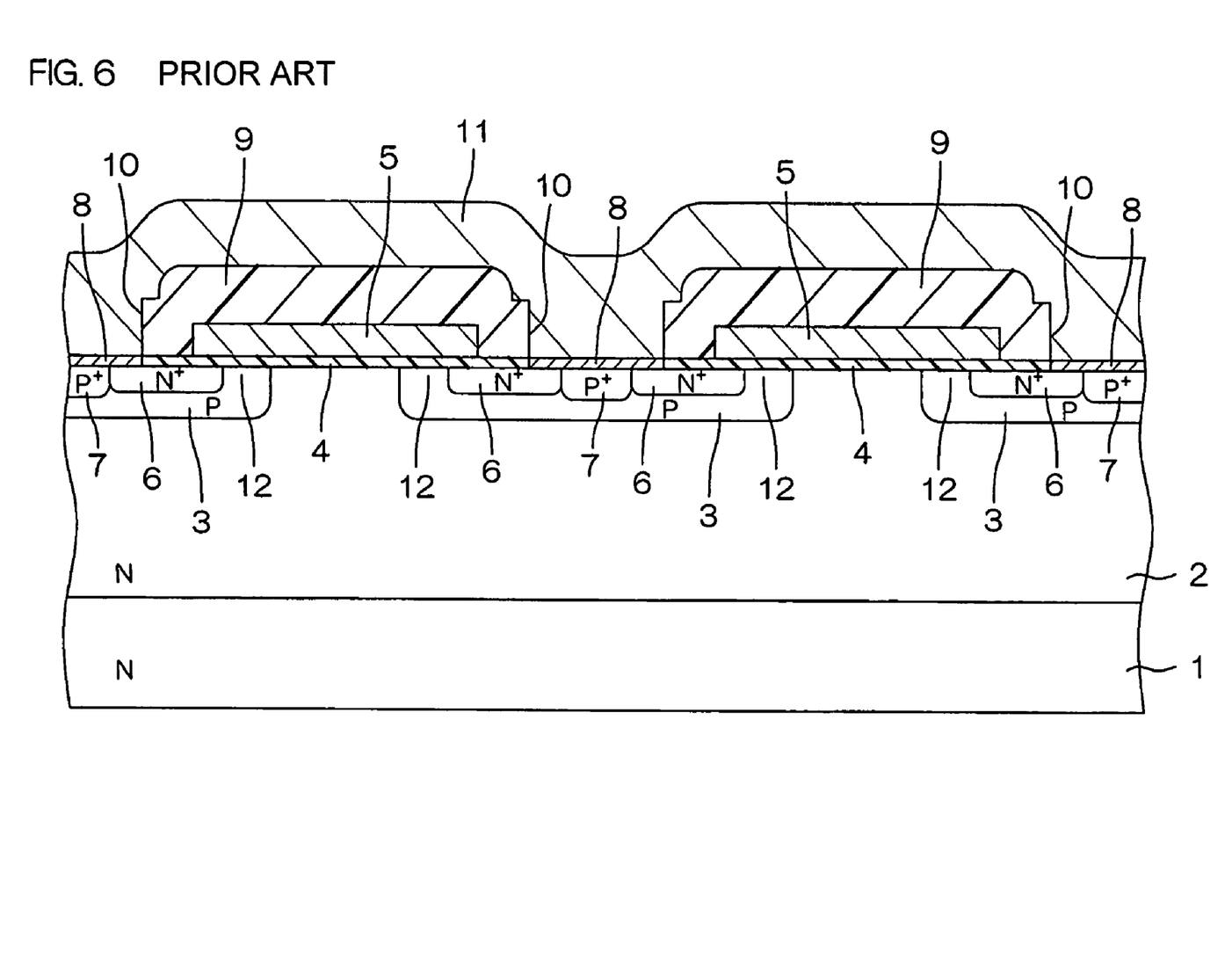
FIG. 6 is a schematic sectional view for describing an example of the structure of the conventional power MOSFET using a SiC semiconductor substrate.

FIG. 6 is an illustrative cross-sectional view showing an example of the structure of the power MOSFET using SiC semiconductor substrate, in which an N type SiC epitaxial layer 2 is formed on the N type SiC semiconductor substrate 1 and MOS structure is formed on the surface layer portion of the SiC epitaxial layer 2. That is, a plurality of P type wells 3 are formed in a spaced relation on the surface layer portion of the SiC epitaxial layer 2, and a gate electrode 5 is formed on an area that spreads across the adjacent P type wells 3 on the SiC epitaxial layer 2 with a gate insulating film 4 sandwiched between the SiC epitaxial layer 2 and the gate electrode 5. The gate electrode 5, although shown to be separated from each other in FIG. 6, is actually a continuous electrode.

In each of the P type wells 3, $N^+$ type source layers 6 are formed along the edge portion of the gate electrode 5, and a $P^+$ type layer 7 connected to the P type well 3 is formed. The $N^+$ type source layer 6 and the $P^+$ type layer 7 are connected to a contact metal 8 (formed of, for example, Ni) formed on the surface of the SiC epitaxial layer 2. The contact metal 8 is joined and electrically connected to a source electrode 11 via a contact hole 10 that is formed on an interlayer insulating film 9 and the gate insulating film 4 which cover the gate electrode 5. The source electrode 11 comprises a metal layer (formed of, for example, Al) formed to cover almost the entire surface of the interlayer insulating film 9, and enters through the contact hole 10 to contact with the contact metal 8.

With such structure, when the gate electrode 5 is applied with an appropriate voltage, an inversion layer is generated at a channel region 12 that is directly underneath the gate electrode 5 in the P type well 3, which allows conduction of electricity between the SiC semiconductor substrate 1 as a drain region for transistor operation and the source layer 6. This can realize a transistor operation.

Figure 7:
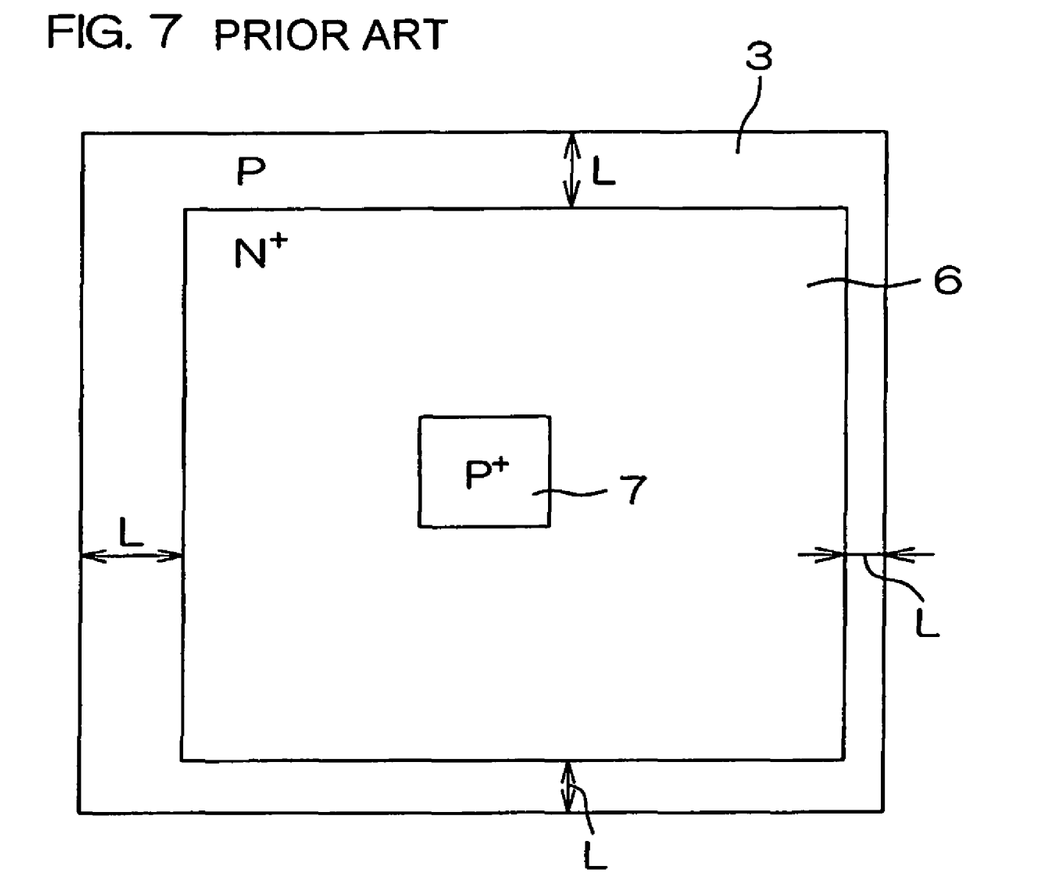
FIG. 7 is a schematic plan view of a part of the power MOSFET as shown in FIG. 6.

The P type well 3 is formed in, for example, a rectangular shape as shown in a schematic plan view of FIG. 7. The inside of the rectangular shaped P type well 3 is formed with the rectangular shaped $N^+$ type source layer 6, and the inside of the rectangular shaped $N^+$ type source layer 6 is formed with the $P^+$ type layer 7. In this case, a channel length L is defined by a distance between the edge portion of P type well 3 and the edge portion of $N^+$ type source layer 6.

Patent Document 1: Japanese Unexamined Patent Publication No. 2000-22137 (FIG. 7)

DISCLOSURE OF THE INVENTION

Problems to be Solved

Unlike the case with Si semiconductor material which introduces impurities by a double diffusion process, the SiC semiconductor material must form impurity diffusion layer mainly by selective doping of ion implantation. Accordingly, the P type well 3 is formed via the ion implantation process using a first mask and the $N^+$ type source layer 6 is formed via the ion implantation process using a second mask.

Therefore, if there is a displacement caused between the first mask and the second mask, the $N^+$ type source layer 6 cannot be aligned in the center portion of the P type well 3 as shown in FIG. 7, and the uniform channel lengths L over the entire target portion cannot be obtained, so that desired device properties cannot be obtained. As a matter of course, in this case, reproducibility cannot be expected from the displacement of the masks and thus undesirable variation cannot be avoided in the device properties of the resultant MOSFET.

In addition, in the case of power MOSFET with the structure as described above, if the space between the P type wells 3 is not sufficient, the current that passes therethrough is subject to a so-called JFET (Junction Field-Effect Transistor) resistance and causes high on-resistance. As a matter of course, this problem can be solved by arranging the P type wells 3 in further spaced apart relation. However, this solution makes the channel width (the total length of the channel region 12) per unit area narrower and increases the channel resistance. The channel resistance, the reduction of which has been the greatest challenge in the MOSFET of SiC semiconductor, can be further increased, which leads to an increase in the on-resistance.

As a result, it has been a difficult challenge to reduce the MOSFET on-resistance (including the JFET resistance and the channel resistance) using SiC semiconductor.

It is therefore the first objective of the present invention to provide a semiconductor device that has a structure that uses SiC semiconductor and provides stable device properties and a method of manufacturing the same.

The second objective of the present invention is to provide a semiconductor device that uses SiC semiconductor and can effectively reduce the on-resistance and a method of manufacturing the same.

Solution to the Problems

The semiconductor device in accordance with the present invention comprises a first conductive type SiC semiconductor substrate (20); a second conductive type well (23) formed on the SiC semiconductor substrate, the second conductive type being different from the first conductive type; a first impurity diffusion layer (41) formed by introducing an impurity of the first conductive type so as to be partly overlapped with the well in a region surrounding the well in the SiC semiconductor substrate; second impurity diffusion layers (42, 26) formed by introducing an impurity of the first conductive type in a region spaced apart for a predetermined distance from the impurity diffusion layer in the well; and a gate electrode (25) opposed to a channel region (35) between the first impurity diffusion layer and the second impurity diffusion layer with a gate insulating film (24) sandwiched therebetween. Hereinafter, it should be noted that the alphanumeric characters in parentheses refer to components and the like corresponding to embodiments to be described. This applies to the whole of this section.

According to this structure in which the channel length can be defined not by a distance between the edge portion of the well and the edge portion of the second impurity diffusion layer but by a distance between the first impurity diffusion layer and the second impurity diffusion layer, stable device properties can be obtained without depending upon how precise the masks are overlapped with each other during the formation of the well and the second impurity diffusion layer by the ion implantation process.

In addition, since the resistance in the region surrounding the well is reduced by the first impurity diffusion layer, the JFET resistance between wells are also reduced by the first impurity diffusion layer when a plurality of wells are disposed adjacent to each other. A plurality of wells can thus be disposed adjacent to each other with a narrow space therebetween, which leads to narrow space between the adjacent gate electrodes to allow finer structure. In this manner, the channel width per unit area can be increased, the JFET resistance can be reduced, and as a result the on-resistance can be reduced.

It is preferable that the semiconductor device further comprises a first conductive type source diffusion region (26), and the source diffusion region is formed in a region where the semiconductor device is overlapped at least partially with the second impurity diffusion layer in the well. This allows the second impurity diffusion layer to be electrically connected to the source region.

It is also preferable that the first impurity diffusion layer and the second impurity diffusion layer are concurrently formed using one mask (37) via the ion implantation process.

With this structure, the first and the second impurity diffusion layers are concurrently formed using a common mask via the ion implantation process, so that the layers are arranged in a self-aligned manner to ensure a constant distance therebetween. Accordingly, the channel length can be more stable and thereby stable device properties of the semiconductor can be achieved.

The method of manufacturing the semiconductor device of the present invention comprises the steps of: forming a well (23) by introducing a second conductive type impurity into a first conductive type SiC semiconductor substrate (20); forming a first impurity diffusion layer (41) formed by introducing an impurity of the first conductive type so as to be partly overlapped with the well in a region surrounding the well in the SiC semiconductor substrate; forming second impurity diffusion layers (42, 26) formed by introducing an impurity of the first conductive type in a region spaced apart for a predetermined distance from the impurity diffusion layer in the well; and disposing a gate electrode (25) as opposing to a channel region (35) between the first impurity diffusion layer and the second impurity diffusion layer with a gate insulating film (24) sandwiched therebetween. In this manner, the semiconductor device with the aforementioned structure can be obtained.

It is preferable that the steps of forming the first impurity diffusion layer and the second impurity diffusion layer are conducted concurrently using a common mask (37) that has an opening corresponding thereto via the ion implantation process.

Aforementioned or other objectives, features and effects of the present invention will be elucidated more fully hereinafter with reference to the following description of the embodiments accompanied by appended drawings.

DESCRIPTION OF THE REFERENCE NUMERAL

20 . . . N type semiconductor substrate, 21 . . . $N^+$ type SiC substrate, 22 . . . N type epitaxial layer, 23 . . . P type well, 24 . . . gate insulating film, 25 . . . gate electrode, 26 . . . $N^+$ type source layer, 27 . . . $P^+$ type layer, 28 . . . contact metal, 29 . . . interlayer insulating film, 30 . . . contact hole, 31 . . . source electrode, 32 . . . drain electrode, 35 . . . channel region, 37 . . . ion implantation mask, 41 . . . first N type impurity diffusion layer, 42 . . . second N type impurity diffusion layer

BEST MODE FOR CARRYING OUT THE INVENTION

Figure 1:
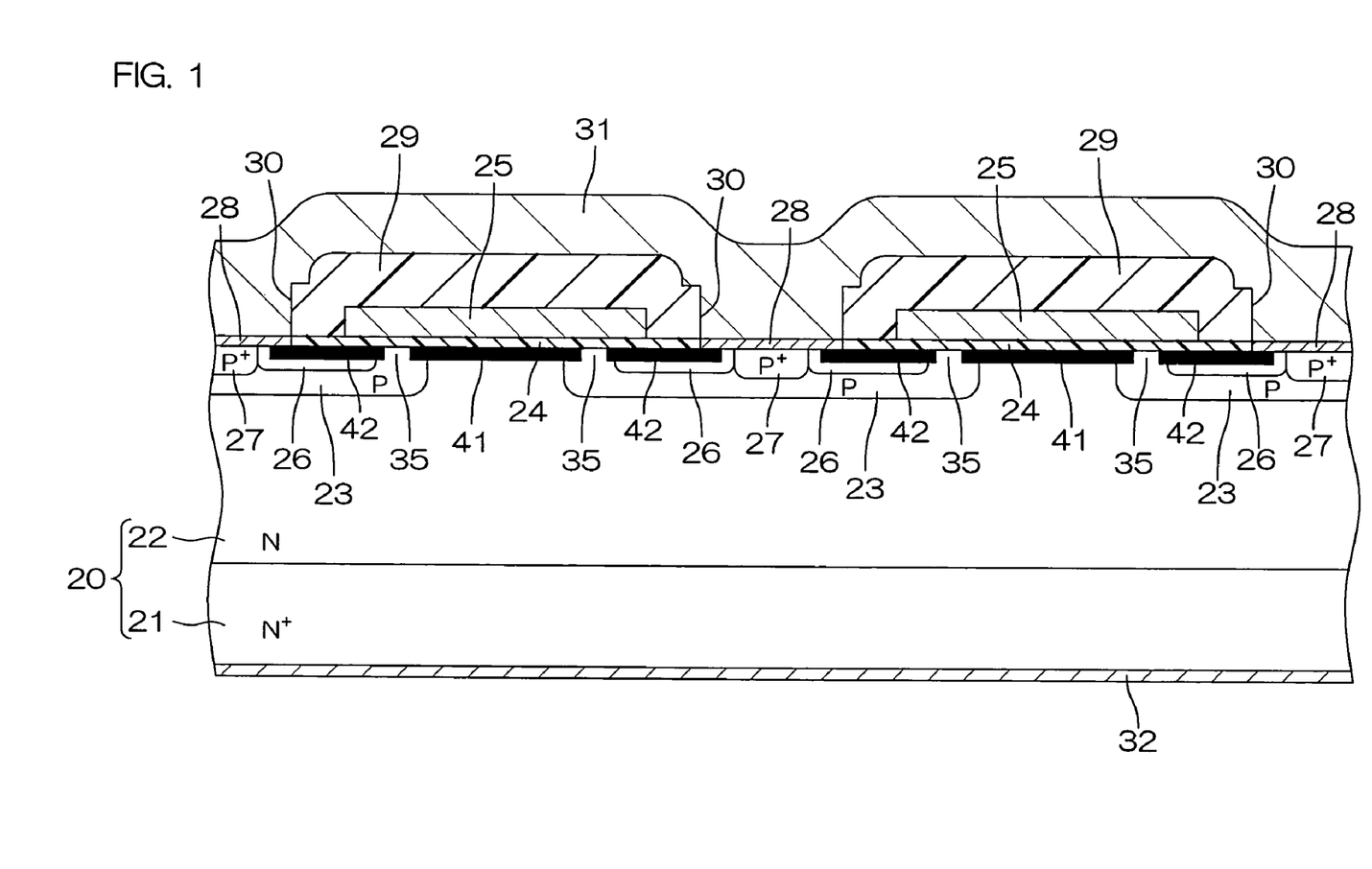
FIG. 1 is a schematic sectional view for describing an arrangement of a power MOSFET as an individual semiconductor element according to a first embodiment of the present invention.

FIG. 1 is a schematic sectional view for describing an arrangement of a power MOSFET as an individual semiconductor element according to a first embodiment of the present invention. The power MOSFET comprises a SiC semiconductor substrate 20 that is formed by growing a N type SiC epitaxial layer 22 on a $N^+$ type SiC substrate 21. A plurality of P type wells 23 are formed in spaced relation on the surface portion of an N type epitaxial layer 22. In this embodiment, each of the P type wells 23 is formed in, for example, a rectangular shape (including a square), and the rectangular shaped P type wells 23 are distributed, for example, in grid on the SiC semiconductor substrate 20, as shown in a schematic plan view of FIG. 2.

On the surface of the SiC semiconductor substrate 20, gate electrodes 25 are formed so as to spread across the region of the adjacent P type wells 23 with gate insulating films 24 sandwiched between the SiC semiconductor substrate 20 and the gate electrodes 25. In each of the P type wells 23, $N^+$ type source layers 26 are respectively formed at the edge portions of the gate electrode 25 in opposed relation with the gate insulating film 24 therebetween. In this embodiment, the $N^+$ type source layers 26 have a rectangular shape that is almost similar to the shape of the P type wells 23, and with P+ type layer 27 for wiring the P type well 23 are provided at the central portion of the N+ type source layers 26.

The gate electrode 25 is covered with an interlayer insulating film 29. The interlayer insulating film 29 and the gate insulating film 24 are formed with contact holes 30 that expose a part of the P+ type layer 27 and N+ type source layers 26 around the P+ type layer 27. On the bottom of the contact holes 30, contact metals 28 are formed and electrically connected with the P+ type layer 27 and the N+ type source layers 26. A source electrode 31 is formed so as to cover almost the entire surface of the interlayer insulating film 29. The source electrode 31 enters through the contact holes 30 and joined to the contact metals 28. The lower surface of the SiC board 21 to be served as a drain is formed with a drain electrode 32.

Figure 2:
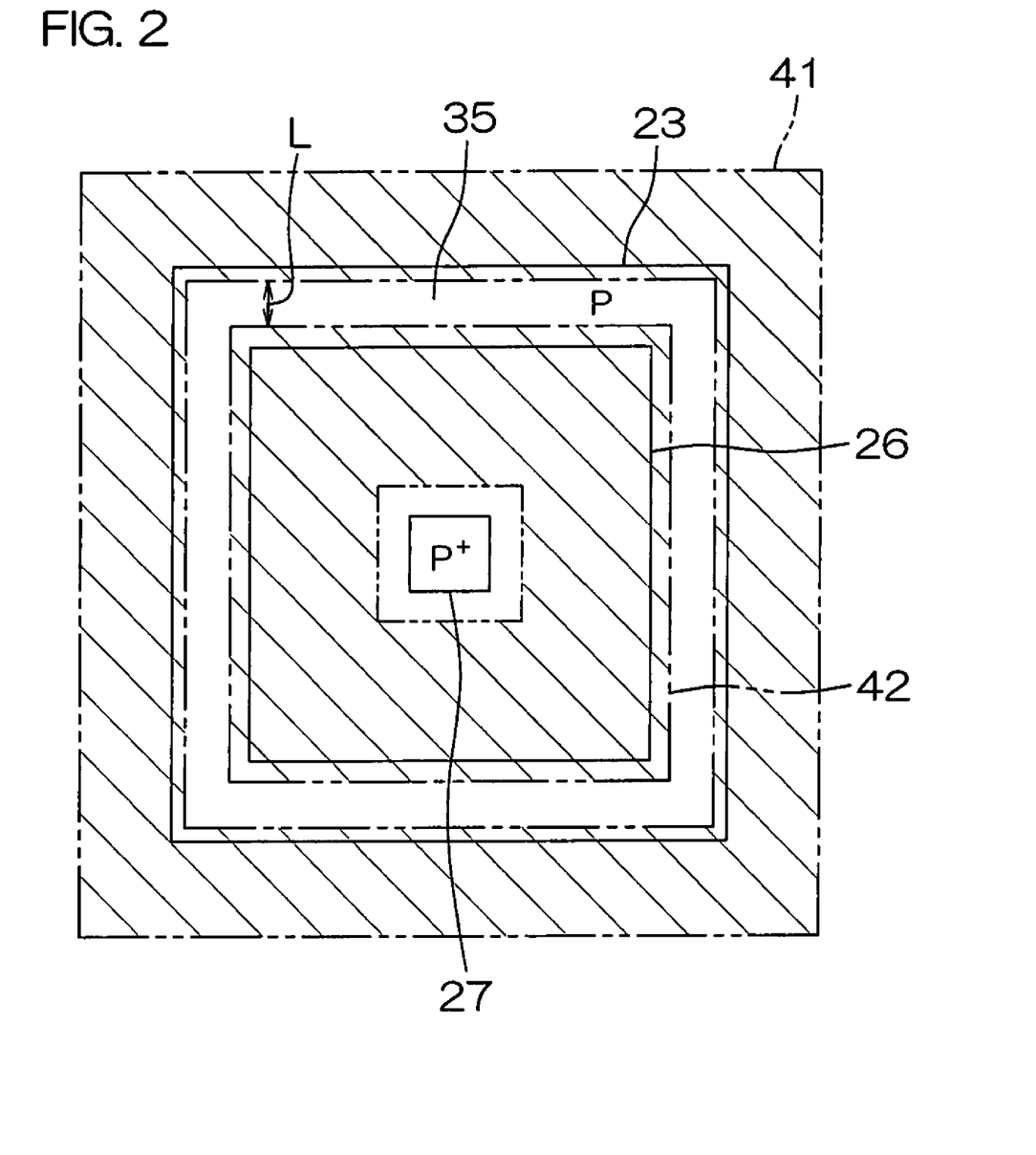
FIG. 2 is a schematic plan view of a part of the power MOSFET.

On the surface portion of the N type epitaxial layer 22 (the surface portion of the SiC semiconductor substrate 20) and in a region surrounding each of the P type wells 23 (a region between the adjacent P type wells 23), a first N type impurity diffusion layer 41 is formed (shown as the diagonally shaded areas defined by a chain double-dashed line in FIG. 2). The first N type impurity diffusion layer 41 is formed so as to be overlapped with the end portion of the P type well 23.

On the other hand, in the P type wells 23, a second N type impurity diffusion layers 42 are formed so as to be opposed with the end portion of the first N type impurity diffusion layer 41 (shown as the diagonally shaded areas defined by a chain double-dashed line in FIG. 2). In this embodiment, the second N type impurity diffusion layer 42 is formed in a rectangular ring shape and overlapped for the most part with the N+ type source layers 26 with their end portions extruding outward from the N+ type source layers 26 and disposed in the P type well 23.

In this embodiment, the first N type impurity diffusion layers 41 and the second N type impurity diffusion layers 42 are formed in a self-aligned manner via the ion implantation process using a common mask, and the distance between the opposing end portions of the first N type impurity diffusion layers 41 and the second N type impurity diffusion layers 42 are made to be thoroughly constant. It is preferable that the distance is, for example, 0.3 μm to 2.0 μm.

With such structure, when the gate electrode 25 is applied with an appropriate voltage, an inversion layer (channel) is generated at a portion that is opposed to the gate electrode 25. Through the inversion layer, the first and the second N type impurity diffusion layers 41, 42 are brought into conduction, which allows current to flow from the N type SiC semiconductor substrate 20 that serves as a drain region to the source electrode 31.

The P type region between the first and the second N type impurity diffusion layers 41, 42 substantially serves as a channel region 35 in the P+ type well 23. The distance (channel length) L of the channel region 35, which is defined by the distance between the first and the second N type impurity diffusion layers 41, 42, is made to be thoroughly constant as mentioned above. On this account, stable device properties can be obtained and the variations generated among products can be reduced.

The first N type impurity diffusion layer 41 formed in a region between the P type wells 23 reduces the JFET resistance when current flows between the adjacent P type wells 23. For this reason, a plurality of P type wells 23 can be disposed adjacent to each other without largely increasing the JFET resistance. As a result, larger number of P type wells 23 can be disposed in a unit area to achieve finer structure.

Accordingly, the channel width that is the total length of the channel region 35 can be increased to achieve the on-resistance reduction.

In addition, since the first and the second N type impurity diffusion layers 41, 42 are formed via the ion implantation process using a common mask in a self-aligned manner, the distance between these layers can be reduced to shorten the channel length L. This allows reduction in the channel resistance and further reduction in the on resistance.

Figure 3A:
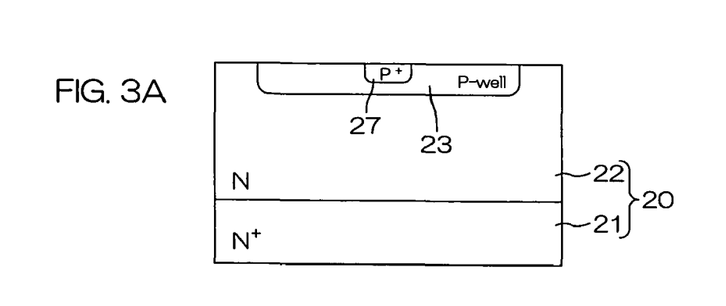
FIG. 3A through FIG. 3F are schematic sectional views for describing a manufacturing process of the power MOSFET.

FIG. 3A through FIG. 3F are schematic sectional views for describing a manufacturing process of the power MOSFET. As shown in FIG. 3A, first, the N type epitaxial layer 22 is grown on the N+ type SiC board 21, and the P type well 23 is formed via the ion implantation process. Then, the P+ type layer 27 is formed via the ion implantation process of the P type impurity at around the central portion of the P type well 23 using another mask.

Figure 3B:
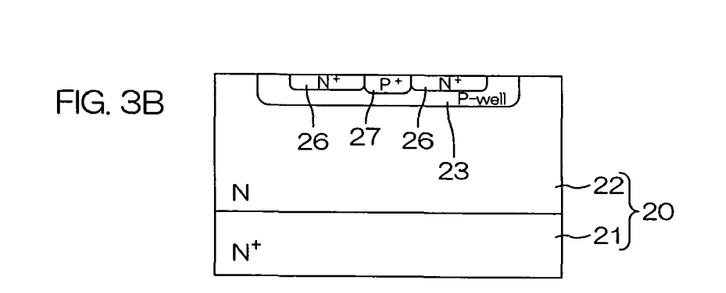

Subsequently as shown in FIG. 3B, the N+ type source layers 26 are formed via the implantation of the N type impurity ion using another mask.

Figure 3C:
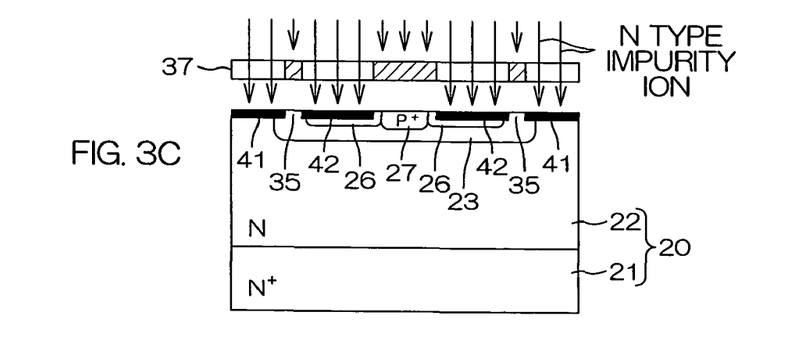

Then, as shown in FIG. 3C, the first and the second N type impurity diffusion layers 41, 42 are concurrently formed via the implantation of the N type impurity ion using the ion implantation mask 37 which is formed with the pattern of openings corresponding to the first and the second N type impurity diffusion layers 41, 42.

Figure 3D:
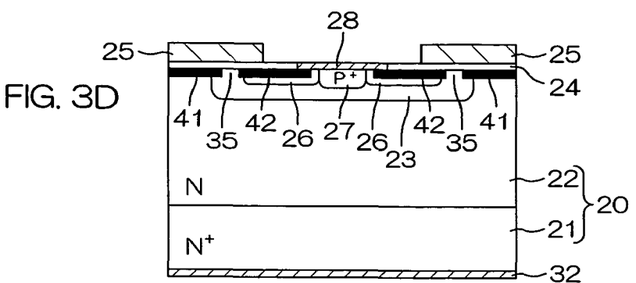

Thereafter, as shown in FIG. 3D, the surface of the SiC semiconductor substrate 20 is formed with the gate insulating film 24, and further with the gate electrodes 25 (formed of, for example, polysilicon) which have a pattern to expose the central region of the P type well 23. Then, at the central portion of the gate insulating film 24 in a region that is exposed from the gate electrode 25, an opening is formed that exposes a part of the P+ type layer 27 and a part of the region of the N+ type source layers 26, then into this opening, the contact metal 28 formed of, for example, Ni is buried. On the lower surface of the N+ type SiC substrate 21, a metal film to be served as the drain electrode 32 is formed.

Figure 3E:
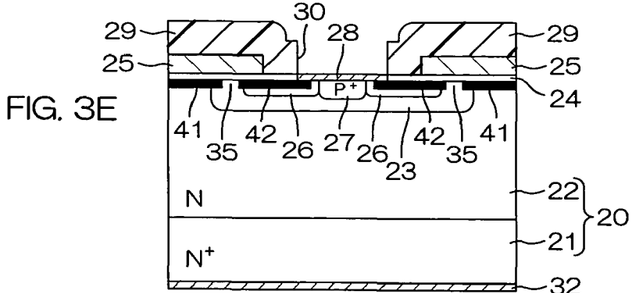

After that, as shown in FIG. 3E, the upper region of the contact metal 28 is formed with the interlayer insulating films 29 (formed of, for example, $SiO_2$) which have contact holes 30 and cover the gate electrodes 25.

Figure 3F:
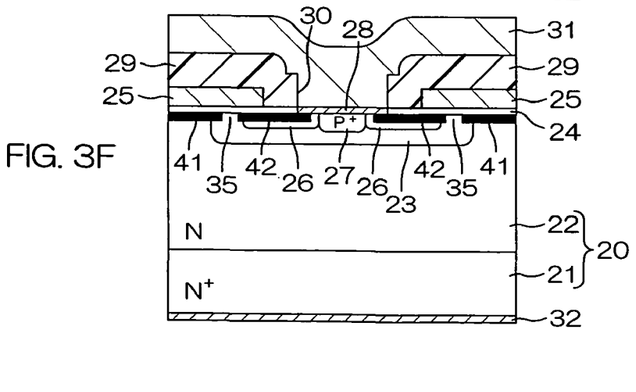

Finally, as shown in FIG. 3F, the entire surface is covered with a metal film (formed of, for example, Al) which constitutes the source electrode 31. The source electrode 31 enters through the contact holes 30 and is joined to the contact metal 28.

In the way stated hereinabove, the power MOSFET having the structure shown in FIG. 1 can be obtained.

Since the first and second N type impurity diffusion layers 41, 42 are formed in a self-aligned manner via the ion implantation process using the common ion implantation mask 37, the channel length L which is defined by a distance between the layers is made to be thoroughly constant on the SiC semiconductor substrate 20. On this account, stable device properties can be obtained and the variations among products can be reduced.

Figure 4:
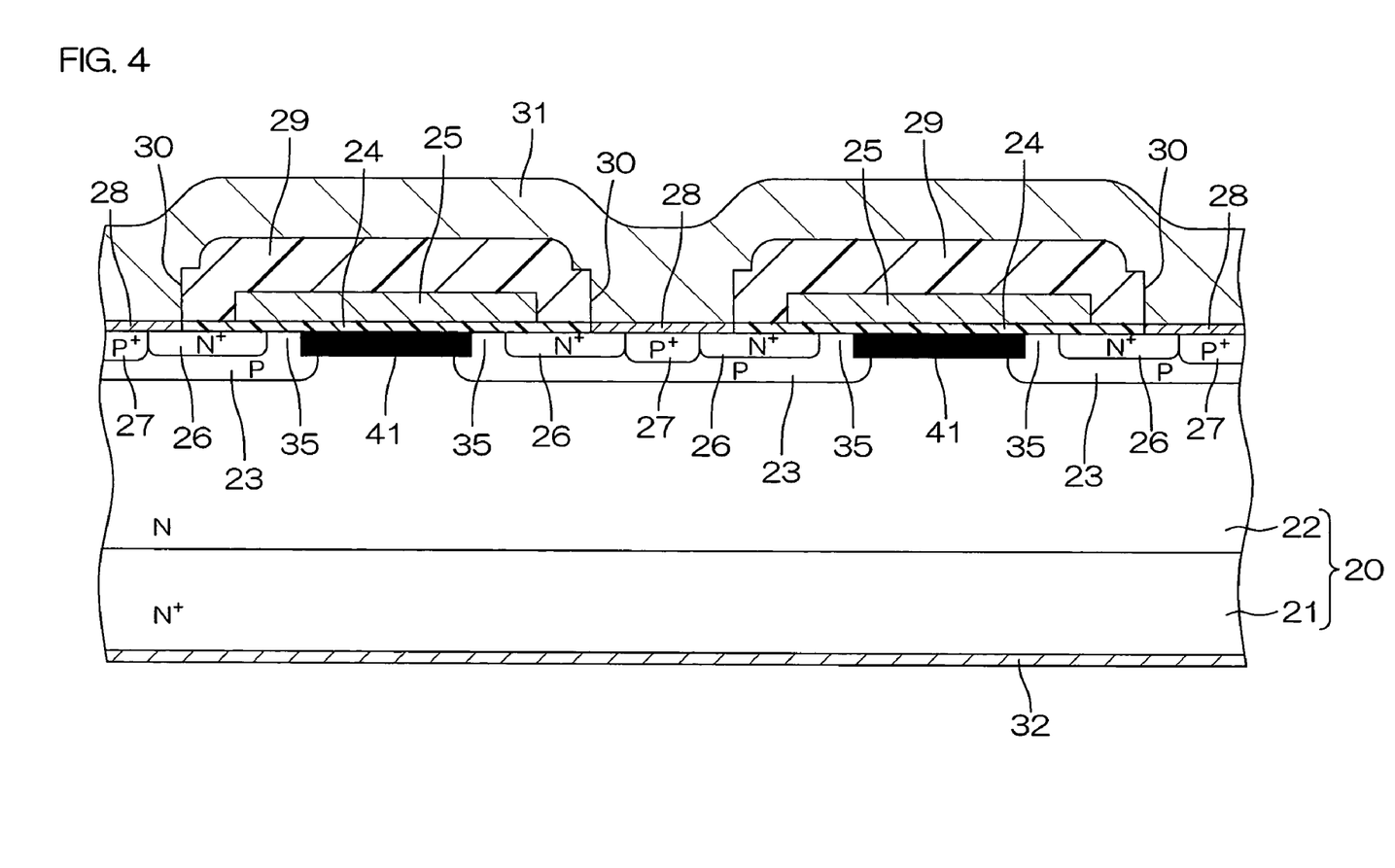
FIG. 4 is a schematic sectional view for describing the arrangement of the power MOSFET according to a second embodiment of the present invention.

FIG. 4 is a schematic sectional view for describing the arrangement of the power MOSFET according to a second embodiment of the present invention. In FIG. 4, elements corresponds to those elements shown in FIG. 1 described above will be given the same reference characters. It should be noted that in this embodiment the second N type impurity diffusion layer 42 in the first embodiment is not provided. On the other hand, the region surrounding the P type well 23 (regain between the P type wells 23) is provided with the N type impurity diffusion layer 41 which has the end portion entering through the P type well 23. Accordingly, a region between the N type impurity diffusion layer 41 and the N⁺ type source layer 26 makes the channel region 35, and by this distance therebetween, the channel length L is defined.

In this embodiment, the N type impurity diffusion layer is formed in a self-aligned manner using a common ion implantation mask shared with the N⁺ type source layer 26, where the N⁺ type source layer 26 serves as the second N type impurity diffusion layer. On this account, as similar to the case with the first embodiment mentioned hereinabove, the channel length L is made to be thoroughly constant on the substrate 20 and stable device properties can be obtained.

As a matter of course, since the N type impurity diffusion layer 41 can reduce the JFET resistance, the distance between the P type wells 23 can be reduced in an attempt for finer structure, thereby increasing the channel width and decreasing the on-resistance. Furthermore, the distance between the N type impurity diffusion layer 41 and the N⁺ type source layer 26 which are formed in a self-aligned manner can be reduced (for example, 0.3 micrometers to 2.0 micrometers) to reduce the channel length L. As a result, the channel resistance can further be reduced, which can lead to the on-resistance reduction.

Figure 5:
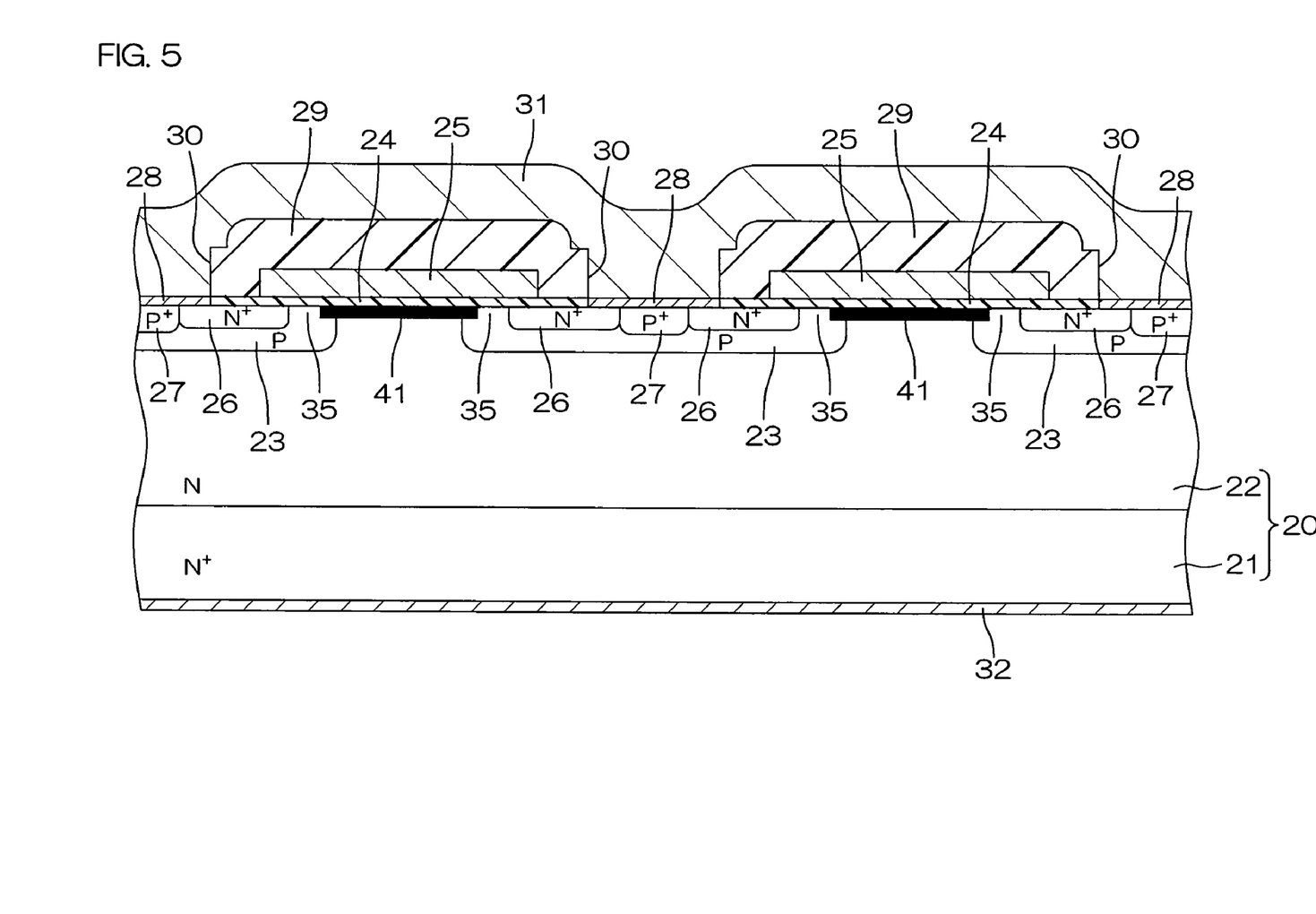
FIG. 5 is a schematic sectional view for describing another modification of the second embodiment.

FIG. 5 shows a case in which the arrangement shown in aforementioned FIG. 4 is modified in such a way that the N type impurity diffusion layer 41 is formed by an ion implantation process that is different from the process of forming the N⁺ type source layer 26. In this case, the thickness of the N⁺ type source layer 26 and the thickness of the N type impurity diffusion layer 41 are different from each other. With this arrangement, the impurity concentration and the thickness of the N type impurity diffusion layer 41 can be determined without depending upon the N⁺ type source layer 26. Therefore, the impurity concentration and the diffusion depth of the N type impurity diffusion layer 41 can be determined appropriately in consideration with the reduction target value of the JFET resistance or the necessary withstand pressure, and thus a power MOSFET that can achieve both the stable device properties and the reduction of on-resistance can be obtained.

Hereinabove, the embodiments of the present invention have been described. However, it should be noted that the present invention can also be implemented according to other embodiments. For example, although a power MOSFET has been used in the aforementioned embodiments, the present invention can also be applied to semiconductor devices with other structures such as the IGBT (Insulated Gate Bipolar Transistor).

Furthermore, although in the aforementioned embodiment, an N channel type MOSFET is formed on an N type SiC semiconductor substrate 20, a P channel type MOSFET can be alternatively formed by using a P type SiC semiconductor substrate with each of the conductive type reversed from each of the aforementioned embodiments.

While the embodiments of the present invention are provided in the above description in detail, such is for illustrative purpose only and they are not to be construed restrictively. The spirit and scope of the present invention is to be limited only by the appended claims.

This application corresponds to Japanese Patent Application No. 2005-125497 filed in the Japanese Patent Office on Apr. 22, 2005, the entire disclosure of which is incorporated herein by reference.

What is claimed is:

1. A semiconductor device, comprising:
   a first conductive type SiC semiconductor substrate;
   a second conductive type well formed on the SiC semiconductor substrate, the second conductive type being different from the first conductive type;
   a first impurity diffusion layer formed by introducing a first impurity of the first conductive type in a first region surrounding the well in the SiC semiconductor substrate and partially overlapping the well;
   a second impurity diffusion layer formed by introducing a second impurity of the first conductive type in a second region in the well, the second impurity diffusion layer being spaced apart by a predetermined distance from the first impurity diffusion layer;
   a gate electrode opposed to a channel region between the first impurity diffusion layer and the second impurity diffusion layer with a gate insulating film sandwiched between the gate electrode and the first and second impurity diffusion layers; and
   a source diffusion region of the first conductive type, the source diffusion region being formed in a third region in the well so as to be overlapped at least partially with the second impurity diffusion layer,
   wherein the first and second impurity diffusion layers have respective outer peripheries, the first impurity diffusion layer has an inner periphery, and the channel region is disposed between the outer periphery of the second impurity diffusion layer and the inner periphery of the first impurity diffusion layer, and
   wherein the source impurity region has an outer periphery, the outer periphery of the second impurity diffusion layer being closer than the outer periphery of the source impurity region to the first impurity diffusion layer, and
   wherein the concentration of the source diffusion region is higher than that of the second conductive type well.

2. The semiconductor device as set forth in claim 1, wherein the first impurity diffusion layer and the second impurity diffusion layer are concurrently formed via an ion implantation process using one mask.

3. The semiconductor device as set forth in claim 1, wherein the first impurity is a predetermined substance and the second impurity is also the predetermined substance.

4. A semiconductor device, comprising:
   an SiC semiconductor substrate having a first conductivity type;
   a well having a second conductivity type formed in the substrate, the well having an outer periphery;
   a first impurity diffusion region formed by introducing impurity particles of the first conductivity type into the substrate, the first impurity diffusion region having an annular shape with an inner periphery and an inner peripheral region that overlaps the well, the first impurity diffusion region additionally having an outer periphery;
   a second impurity diffusion region formed by introducing impurity particles of the first conductivity type into the well, the second impurity diffusion region having an outer periphery that is evenly spaced apart from the inner periphery of the first impurity region, a channel region being disposed between the inner periphery of the first impurity diffusion region and the outer periphery of the second impurity diffusion region;
   a source diffusion region formed by introducing impurity particles of the first conductivity type into the well, the source diffusion region being partially overlapped by the second impurity diffusion region;

a gate electrode having a portion that is disposed over the channel region; and a gate insulating film disposed between the gate electrode and the substrate.

5. The semiconductor device as set forth in claim 4, wherein the impurity particles of the first and second impurity diffusion regions are impurity particles of the same substance.

6. The semiconductor device as set forth in claim 4, further comprising an additional impurity diffusion region formed by introducing particles of the second conductivity into the well, and wherein the second impurity diffusion region has an annular shape with an inner periphery that is disposed around the additional impurity diffusion region.

7. The semiconductor device as set forth in claim 4, wherein the well, the first and second impurity diffusion regions, the source diffusion region, the gate electrode, and the gate insulating film are located at a first side of the substrate, and further comprising an electrode on a second side of the substrate, the second side being opposite the first side.

* * * * *